United States Patent
Lin et al.

(10) Patent No.: US 11,427,910 B2
(45) Date of Patent: Aug. 30, 2022

(54) ATOMIC LAYER DEPOSITION EQUIPMENT CAPABLE OF REDUCING PRECURSOR DEPOSITION AND ATOMIC LAYER DEPOSITION PROCESS METHOD USING THE SAME

(71) Applicant: SKY TECH INC., Hsinchu County (TW)

(72) Inventors: Jing-Cheng Lin, Hsinchu County (TW); Ta-Hao Kuo, Hsinchu County (TW)

(73) Assignee: SKY TECH INC., Hsinchu Count (TW)

( * ) Notice: Subject to any disclaimer, the term of this patent is extended or adjusted under 35 U.S.C. 154(b) by 38 days.

(21) Appl. No.: 17/075,678

(22) Filed: Oct. 20, 2020

(65) Prior Publication Data

US 2022/0119945 A1 Apr. 21, 2022

(51) Int. Cl.
*C23C 16/40* (2006.01)
*C23C 16/455* (2006.01)

(52) U.S. Cl.
CPC .. *C23C 16/45544* (2013.01); *C23C 16/45527* (2013.01)

(58) Field of Classification Search
CPC ........ C23C 16/45544; C23C 16/45527; C23C 16/4412
USPC .................. 118/715; 156/345.33, 345.34
See application file for complete search history.

(56) References Cited

U.S. PATENT DOCUMENTS

| | | | | |
|---|---|---|---|---|
| 7,468,104 B2 * | 12/2008 | Mardian | ............. | C23C 16/4401 118/728 |
| 7,794,546 B2 * | 9/2010 | Li | ......................... | C23C 16/4401 156/345.31 |
| 8,475,625 B2 * | 7/2013 | Pamarthy | ............. | H01J 37/3244 438/689 |
| 8,858,754 B2 * | 10/2014 | Horiguchi | ........... | H01J 37/3244 156/345.43 |
| 10,636,629 B2 * | 4/2020 | Noorbakhsh | ........... | E05D 15/56 |
| 2003/0215569 A1 * | 11/2003 | Mardian | ............... | C23C 16/455 427/248.1 |
| 2004/0033310 A1 * | 2/2004 | Sarigiannis | ........... | C23C 16/455 427/255.28 |
| 2005/0028732 A1 * | 2/2005 | Mardian | ........... | C23C 16/45519 118/715 |

(Continued)

*Primary Examiner* — Rudy Zervigon
(74) *Attorney, Agent, or Firm* — Chun-Ming Shih; HDLS IPR Services

(57) ABSTRACT

An atomic layer deposition equipment capable of reducing precursor deposition and an atomic layer deposition process method using the same are disclosed. The atomic layer deposition equipment includes a chamber, a stage, a precursor inlet, a shielding component, at least one gas inlet, and at least one pumping port, wherein the stage and the shielding component are disposed in a containing space of the chamber. The shielding component shields part of the inner surface of the chamber, and the gas inlet is fluidly connected to the containing space for introducing an inactive gas to the space between the chamber and the shielding component to prevent the precursor from entering. The pumping port pumps out the precursors that have not reacted with a substrate, thereby reducing the precursors remaining on the inner surface of the chamber, prolonging the cleaning cycle of the chamber and improving the product yield.

7 Claims, 8 Drawing Sheets

(56) References Cited

U.S. PATENT DOCUMENTS

| | | | | |
|---|---|---|---|---|
| 2007/0116872 A1* | 5/2007 | Li | ................... | C23C 16/402 |
| | | | | 700/121 |
| 2007/0116873 A1* | 5/2007 | Li | ................... | C23C 16/4401 |
| | | | | 700/121 |
| 2007/0157683 A1* | 7/2007 | Li | ................... | H01L 21/67126 |
| | | | | 70/209 |
| 2007/0209588 A1* | 9/2007 | Li | ................... | C23C 16/4412 |
| | | | | 118/733 |
| 2007/0209590 A1* | 9/2007 | Li | ................... | C23C 16/4401 |
| | | | | 118/733 |
| 2007/0212484 A1* | 9/2007 | Li | ................... | C23C 16/4412 |
| | | | | 118/733 |
| 2012/0184054 A1* | 7/2012 | Suzuki | ................... | C23C 16/24 |
| | | | | 118/712 |
| 2016/0319425 A1* | 11/2016 | Du | ................... | C23C 16/4412 |
| 2018/0057937 A1* | 3/2018 | Lee | ................... | H01J 37/32449 |
| 2019/0338420 A1* | 11/2019 | Srivastava | ................... | H01L 21/6719 |
| 2021/0002763 A1* | 1/2021 | Pathak | ................... | C23C 16/4408 |
| 2021/0156024 A1* | 5/2021 | Roh | ................... | C23C 16/45508 |
| 2021/0166925 A1* | 6/2021 | Moon | ................... | C23C 16/45521 |

* cited by examiner

ATOMIC LAYER DEPOSITION EQUIPMENT
CAPABLE OF REDUCING PRECURSOR
DEPOSITION AND ATOMIC LAYER
DEPOSITION PROCESS METHOD USING
THE SAME

TECHNICAL FIELD

This present disclosure relates to an atomic layer deposition equipment capable of reducing precursor deposition and an atomic layer deposition process method using the same, more particularly, to an atomic layer deposition equipment and an atomic layer deposition process method that are capable of reducing precursor deposition by forming a gas wall between a shielding component and an inner surface of a chamber to prevent unreacted precursors from remaining on the inner surface of the chamber.

BACKGROUND

The integrated circuit (IC) technology has matured, and the current development trend is to make electronic products more lightweight, high-performance, high-reliability and intelligent. The technology of miniaturized transistors in electronic products is very important. The size of the transistor is related to the performance of the electronic product. In electronic products, smaller transistors can reduce current transmission time and reduce energy consumption, so as to quickly calculate and achieve energy-saving effects. At present, in the tiny transistors, some of the key thin film layers are almost only a few atoms thick, and one of the techniques to develop these microstructures is the atomic layer deposition process (ALD process).

The ALD process allows the substance to be deposited layer by layer on the surface of the substrate in the form of single atoms. More specifically, the process allows the precursor to be chemically adsorbed on the surface of the substrate or the material surface of the previous film, thereby producing a uniform and thin film. In the prior art, the unreacted precursor is pumped out from the bottom pumping port of the ALD equipment. However, when the unreacted precursor flows toward the bottom of the chamber, the precursor may remain anywhere and everywhere it passed by in the chamber. Referring to FIG. 1, FIG. 1 is a schematic diagram of a conventional atomic layer deposition equipment. As the unreacted precursor P1 moves toward the bottom pumping port O101, the precursor P1 easily adheres to the inner wall surface 101 of the chamber 1, the inner bottom surface 102 of the chamber 1, and the adjacent area 103 between the bottom of the chamber 1 and the bottom of the stage S0, wherein the inner wall surface 101, the inner bottom surface 102 and the adjacent area 103 can be collectively referred to as the inner surface of the chamber 1. The remaining precursor P1 forms a dense film which causes the chamber 1 to be dirty and coated, and may further become particles and peelings attached to the substrate, resulting in poor product yield.

Because it is difficult to overcome the problem of dirt coating in the chamber of the atomic layer deposition equipment, regular cleaning of the chamber is currently one of the methods to reduce the coating. Generally, the method of cleaning the chamber is to directly brush off the coating on the inner surface of the chamber. However, because the precursors adhered to the inner surface are very dense, the cleaning process is time-consuming and labor-intensive, and causes additional cleaning costs. Furthermore, since the precursors are not easy to remove, if the attached precursors are not completely removed from the chamber, the cleaning cycle needs to be shortened, resulting in a decrease in the production efficiency of the production line. Therefore, how to effectively remove the precursors deposited on the inner surface of the chamber is an issue to be overcome in the current ALD process.

SUMMARY

Therefore, to overcome the deficiencies in the conventional technology, an object of the present disclosure is to provide an atomic layer deposition equipment capable of reducing precursor deposition and an atomic layer deposition process method using the same, which can reduce the adhesion of unreacted precursors to the chamber to reduce the dirt and prolong the cleaning cycle of the chamber.

An atomic layer deposition equipment capable of reducing precursor deposition is disclosed. The atomic layer deposition equipment capable of reducing precursor deposition includes a chamber, a stage, a precursor inlet, a shielding component, at least one gas inlet, and at least one pumping port, wherein the stage and the shielding component are disposed in a containing space of the chamber, and the pumping port and the gas inlet are fluidly connected to the containing space of the chamber. The shielding component shields part of the inner surface of the chamber, and the gas inlet is disposed on the part of the inner surface of the chamber that is shielded by the shielding component. In atomic layer deposition process, gas is introduced into the chamber from the gas inlet to make the gas enter and diffuse to a gap between the inner surface of the chamber and the shielding component, and further diffuse to the containing space of the chamber. In this way, the gas pressure in part of the containing space in the chamber will increase and assist the pumping port to pump out a majority of unreacted precursors. The gas can be an inactive gas that does not react with the precursor and does not corrode the chamber, such as inert gas or nitrogen. The atomic layer deposition equipment capable of reducing precursor deposition can reduce the adhesion of precursors to the inner surface of the chamber, thereby reducing the dirt coating caused by the precursors in the chamber, so as to optimize the product yield and prolong the cleaning cycle of the equipment.

In short, the present disclosure provides an atomic layer deposition equipment capable of reducing precursor deposition by introducing the inactive gas from the gas inlet to between the inner surface (for example, the inner wall surface) of the chamber and the shielding component. After the inactive gas is between the inner surface and the shielding component, the inactive gas will enter the containing space of the chamber to generate a positive pressure to assist in pumping out most of the unreacted precursors by the pumping port, and a small amount of remaining unreacted precursors adheres to the shielding component instead of the inner surface of the chamber (for example, the inner wall surface and the inner bottom surface). Furthermore, the atomic layer deposition equipment capable of reducing precursor deposition further includes a second opening disposed in other inner surface of the chamber (such as, inner bottom surface), and the positive pressure in the chamber is formed after introducing an inactive gas (for example, inert gas or nitrogen) from the second opening, to assist in drawing out the remaining precursors via the pumping port, and reduce the adhesion of the precursors to the inner bottom surface of the chamber. The atomic layer deposition equipment capable of reducing precursor deposition can assist in pumping out a majority of unreacted precursors by the pumping port, so as to reduce the accumulation of dirt in the chamber, thereby prolonging the lifetime of the chamber and the cleaning cycle of the equipment. When the dirt deposited in the chamber is reduced, the product yield can be further improved. Therefore, the present disclosure has competitive advantage in the market that requires ALD process (such as IC industry).

It is then an object of the present disclosure to provide an atomic layer deposition equipment capable of reducing precursor deposition. The atomic layer deposition equipment capable of reducing precursor deposition includes a chamber, a stage, a precursor inlet, at least one pumping port, a shielding component, and at least one gas inlet. The chamber has an inner surface which defines a containing space. The stage is disposed in the containing space of the chamber to support at least one substrate. The precursor inlet is fluidly connected to the containing space of the chamber to provide at least one precursor into the containing space of the chamber. The pumping port is fluidly connected to the containing space of the chamber to exhaust at least one precursor in the containing space of the chamber. The shielding component is disposed in the containing space of the chamber and shields part of the inner surface of the chamber, and there is a gap between the shielding component and the inner surface of the chamber, wherein the gap is connected to the containing space. The gas inlet is disposed on the inner surface of the chamber, and the shielding component shields the gas inlet, wherein the gas inlet introduces an inactive gas to between the shielding component and the inner surface of the chamber to make the inactive gas diffuse to the gap between the shielding component and the chamber, and the inactive gas diffuses to the containing space of the chamber through the gap.

It is another object of the present disclosure to provide an atomic layer deposition process method. The atomic layer deposition process method includes: providing a precursor to the containing space of the chamber, introducing the inactive gas from the gas inlet to between the inner surface of the chamber and the shielding component, so that the inactive gas diffuses to the gap between the shielding component and the chamber and diffuses to the containing space of the chamber through the gap, and pumping out a fluid from the chamber by the pumping port; and stopping providing the precursor to the chamber, continually introducing the inactive gas from the gas inlet to between the inner surface of the chamber and the shielding component, and continually pumping out the fluid from the chamber by the pumping port.

Optionally, the inner surface includes an inner wall surface and an inner bottom surface, wherein the shielding component shields part of the inner wall surface and part of the inner bottom surface of the chamber. The inactive gas is introduced from the gas inlet and diffuses to a gap between the shielding component and the inner wall surface and to a gap between the shielding component and the inner bottom surface, and the inactive gas diffuses to the containing space of the chamber through the gaps.

Optionally, the atomic layer deposition equipment capable of reducing precursor deposition further includes at least one second pumping port disposed on the inner bottom surface of the chamber and fluidly connected to the containing space of the chamber, for exhausting the inactive gas or at least one precursor in the containing space of the chamber.

Optionally, the atomic layer deposition equipment capable of reducing precursor deposition further includes at least one hollow component, wherein the pumping port is disposed in the hollow component, and the position of the hollow component is higher than the stage.

Optionally, the atomic layer deposition equipment capable of reducing precursor deposition further includes a baffle disposed below the hollow component, wherein there is an upper exhaust path formed between the baffle and the pumping port of the hollow component.

Optionally, the baffle includes a bottom and at least one annular protrusion, wherein the annular protrusion is disposed on a surface of the bottom, and the bottom of the baffle is connected to the stage.

Optionally, the shielding component includes a substrate entrance, wherein the substrate is transported into the chamber via the substrate entrance, and the inactive gas is introduced to between the substrate entrance and the inner surface of the chamber.

Optionally, the shielding component further includes at least one channel fluidly connected to the substrate entrance, wherein the inactive gas introduced from the gas inlet is introduced into the substrate entrance via the channel to prevent the precursor from entering the substrate entrance of the shielding component.

Optionally, the inactive gas does not react with the precursor.

BRIEF DESCRIPTION OF THE DRAWINGS

The structure as well as preferred modes of use, further objects, and advantages of this present disclosure will be best understood by referring to the following detailed description of some illustrative embodiments in conjunction with the accompanying drawings, in which.

DETAILED DESCRIPTION OF THE PREFERRED EMBODIMENTS

According to embodiments of the present disclosure, an atomic layer deposition equipment capable of reducing precursor deposition is provided. The atomic layer deposition equipment capable of reducing precursor deposition not only has a chamber, a stage, a precursor inlet, a shielding component, at least one gas inlet, and at least one pumping port, but also can have at least one hollow component and a baffle, wherein the shielding component is disposed on the inner side of the inner surface of the chamber (for example, the inner wall surface or the inner bottom surface of the chamber), and there is a first channel between the shielding component and the inner wall surface of the chamber. In the atomic layer deposition process, the precursors enter the chamber from the precursor inlet and react with the substrate or the material on the substrate surface (for example, wafer), and the unreacted precursors remain in the chamber.

The gas inlet of the atomic layer deposition equipment capable of reducing precursor deposition may be disposed on the inner wall surface of the chamber. Through the gas inlet, the gas (an inactive gas such as inert gas or nitrogen) can be introduced between the shielding component and part of the inner surface of the chamber, and a higher pressure environment can be formed in part of the containing space of the chamber, to prevent the precursors from entering between the shielding component and the part of the inner surface of the chamber. The inactive gas diffuses into the gap between the shielding component and the chamber, and diffuses through the gap to the containing space of the chamber, to assist the unreacted precursors to be pumped out from the pumping port, and a very small amount of remaining unreacted precursors will adhere to the shielding component. The atomic layer deposition equipment capable of reducing precursor deposition can make most of the unreacted precursors be pumped out through the pumping port, and prevent the unreacted precursors from adhering to the inner surface of the chamber (such as, the inner wall surface of the chamber, the inner bottom surface of the chamber, and the adjacent area between the bottom of the chamber and the bottom of the stage). The atomic layer deposition equipment capable of reducing precursor deposition can reduce the dirt adhering to the chamber to prolong the cleaning cycle of the chamber, improve the cleaning efficiency, extend the lifetime of the chamber, and increase the product yield.

Figure 1:
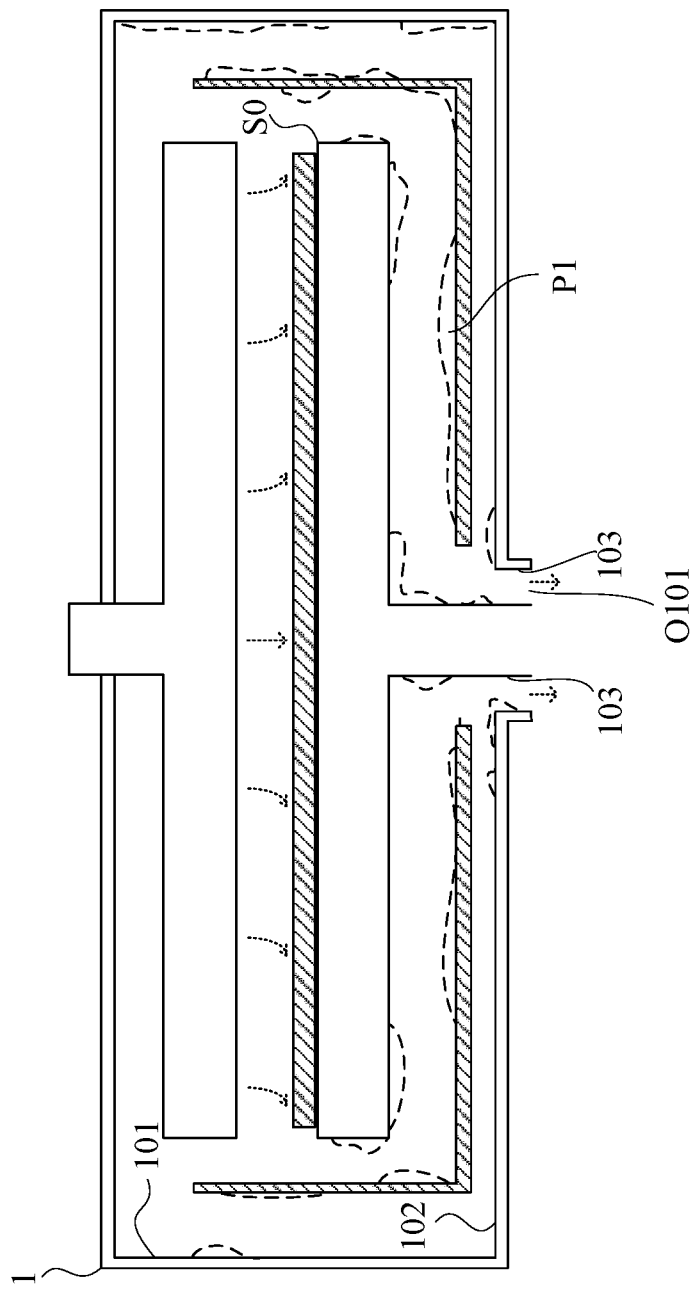
FIG. 1 is a schematic diagram of an atomic layer deposition equipment according to prior art.
Figure 2:
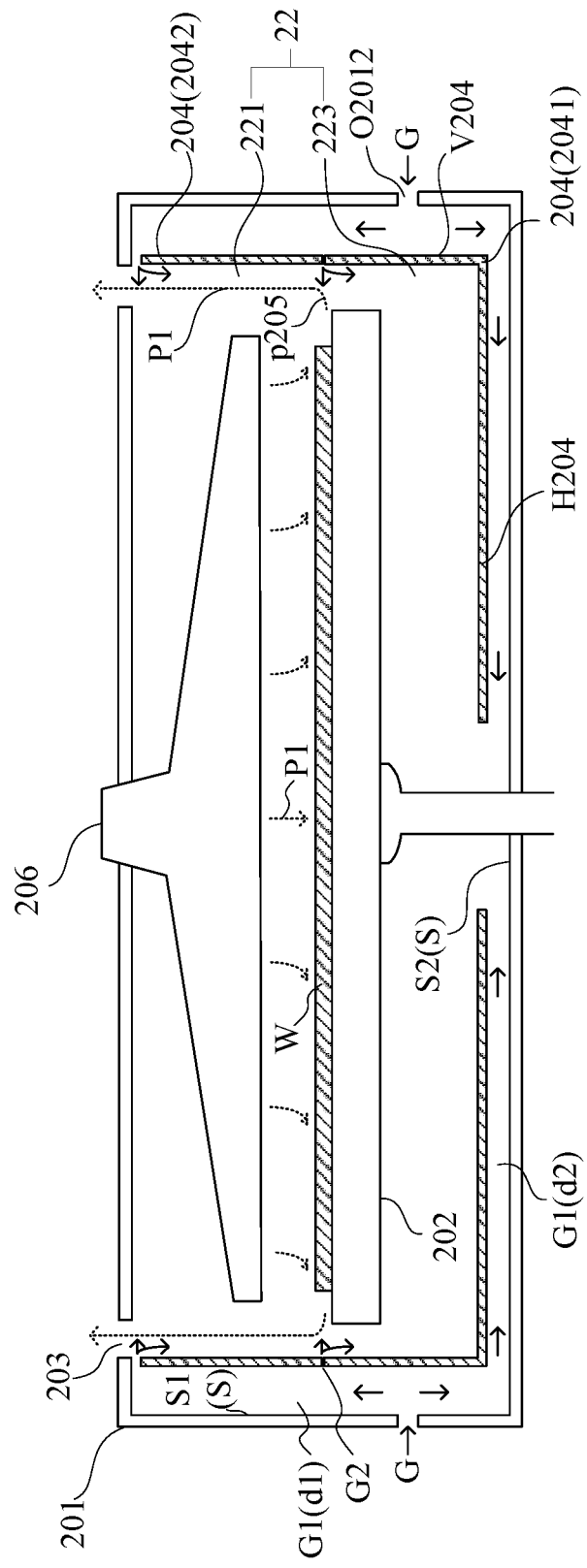
FIG. 2 is a schematic diagram of an atomic layer deposition equipment capable of reducing precursor deposition according to an embodiment of the present disclosure.

FIG. 2 is a schematic diagram of an atomic layer deposition equipment capable of reducing precursor deposition according to an embodiment of the present disclosure. Referring to FIG. 2, the atomic layer deposition equipment capable of reducing precursor deposition 2 has a chamber 201, a stage 202, at least one pumping port 203, a shielding component 204, and at least one gas inlet O2012.

The chamber 201 includes an inner surface S, and the inner surface S defines the containing space 22. The inner surface S includes an inner wall surface S1 and an inner bottom surface S2, wherein the inner wall surface S1 is disposed around the inner bottom surface S2, and there is a plurality of gas inlets O2012 disposed on the inner wall surface S1. The stage 202 and the shielding component 204 are disposed in the containing space 22 of the chamber 201. The shielding component 204 shields a part of the inner surface S of the chamber 201, and there is a gap G1 between the shielding component 204 and the inner surface S of the chamber 201, wherein the gap G1 is connected to the containing space 22. The pumping port 203 is fluidly connected to the containing space 22 of the chamber 201 for exhausting at least one unreacted precursor P1 in the containing space 22.

In one embodiment, the shielding component 204 is disposed in the chamber 201, and shields a part of the inner wall surface S1 of the chamber 201 and the gas inlet O2012. The shielding component 204 may be a combination of a first shielding component 2041 and a second shielding component 2042, and there may be a slit G2 between the first shielding component 2041 and the second shielding component 2042. For example, the appearance of the shielding component 204 may be a hollow cylindrical body, and a first channel d1 is formed in the gap G1 between the shielding component 204 and a part of the inner wall surface S1 of the chamber 201. In other embodiments, the shielding component 204 may only include the first shielding component 2041, the top of the first shielding component 2041 may also extend upward, and the first shielding component 2041 may further have pores to allow gas to pass through.

In another embodiment, the shielding component 204 includes a horizontal extension H204 and a vertical extension V204 connected to each other. The vertical extension V204 is disposed on the inner side of a part of the inner wall surface S1 of the chamber 201 and used to shield a part of the inner wall surface S1. A first channel d1 is formed between the vertical extension V204 and the inner wall surface S1. The horizontal extension H204 is disposed on the inner side of a part of the inner bottom surface S2 of the chamber 201 and used to shield a part of the inner bottom surface S2. A second channel d2 is formed between the horizontal extension H204 and the inner bottom surface S2. There are no limitations on the extension length of the horizontal extension H204 and the vertical extension V204. There are no limitations on the range in which the horizontal extension H204 and the vertical extension V204 shield the inner surface S of the chamber 201. A part of the longitudinal section of the shielding component 204 is, for example, but not limited to, L-shaped.

Figure 3:
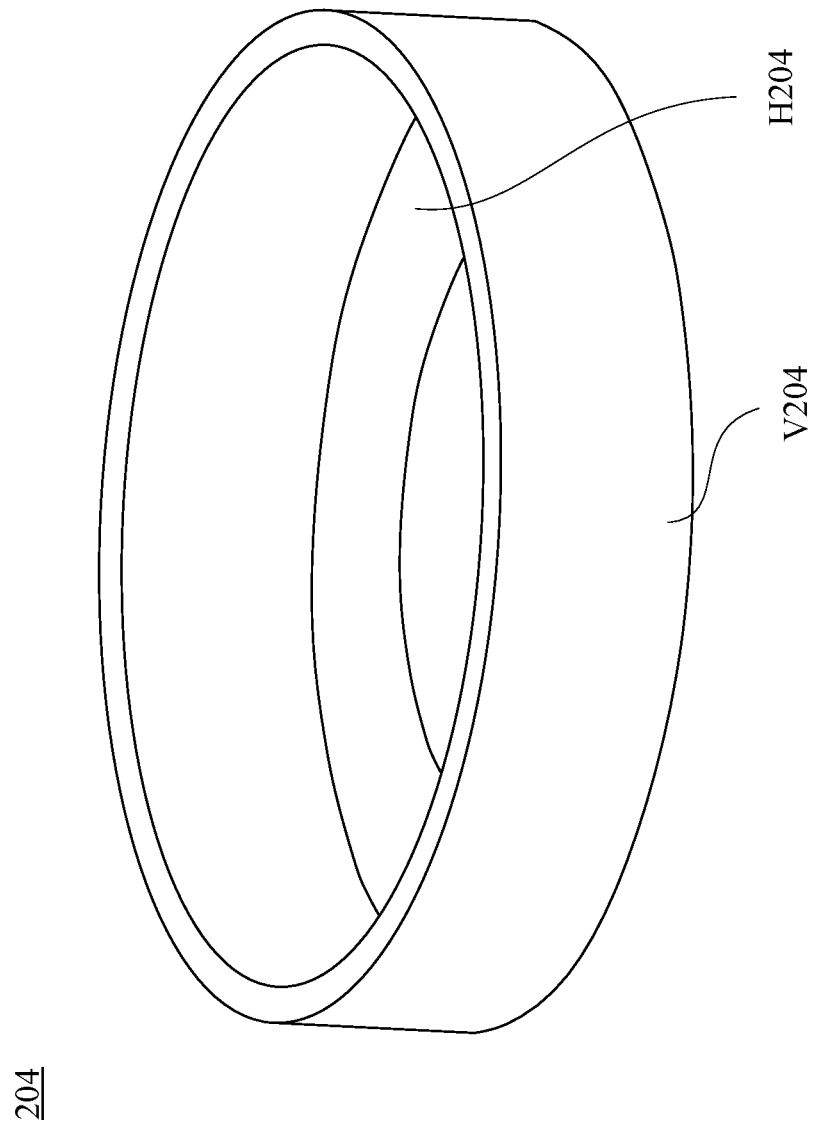
FIG. 3 is a three-dimensional schematic diagram of a shielding component according to an embodiment of the present disclosure.

Referring to FIG. 3, the appearance of the horizontal extension H204 of the shielding component 204 is a flat ring structure, and the horizontal extension H204 forms the bottom of the shielding component 204. The appearance of the vertical extension V204 is a hollow cylindrical body, and the vertical extension V204 is disposed around the horizontal extension H204. The horizontal extension H204 and the vertical extension V204 are not limited to be formed integrally or combined by parts. In other embodiments, the shielding component 204 may also only include the vertical extension V204.

The atomic layer deposition equipment capable of reducing precursor deposition 2 can further include a shower head 206, wherein the shower head 206 is fluidly connected to the chamber 201 to provide the precursor P1 or the purge gas into the chamber 201. The shower head 206 can protrude from the inner surface S of the chamber 201 and is disposed in the containing space 22 of the chamber 201. In other embodiments, the shower head 206 can be mounted on the chamber 201, and it can be a plurality of openings disposed on the inner surface S of the chamber 201, for example, it can be disposed on the top surface of the chamber 201 without protruding out of the inner surface S. In other embodiments, the shower head 206 may be replaced by a precursor inlet 206', wherein the precursor inlet 206' is in fluid connection to the containing space 22 of the chamber 201.

In the atomic layer deposition process, the precursor P1 to be deposited and reacted with the substrate W (for example, wafer) or the substance on the surface of the substrate can be introduced into the chamber 201 from the shower head 206, wherein part of the precursor P1 will react, and most of the unreacted precursors P1 can be pumped out of the chamber 201 from the pumping port 203.

The gas G is introduced from the gas inlet O2012 to between the inner surface S of the chamber 201 and the shielding component 204, so that the gas G diffuses into the gap G1 between the shielding component 204 and the inner surface S of the chamber 201. Further, the gas G diffuses into the containing space 22 of the chamber 201 through the gap G1, so that positive pressure is generated or a gas wall is formed in part of the containing space 22 of the chamber 201 to assist in pumping out the unreacted precursor P1 from the pumping port 203. The gas G is an inactive gas and is selected from inert gas or nitrogen or other gas that does not react with the precursor and does not corrode the atomic layer deposition equipment capable of reducing precursor deposition 2.

Referring to FIG. 2, the gas inlet O2012 is disposed on the inner wall S1 of the chamber 201 that is shielded by the shielding component 204, and the gas G can be introduced from the gas inlet O2012 to between the inner wall surface S1 of the chamber 201 and the shielding component 204. More specifically, the gas G is introduced from the gas inlet O2012 to between the inner bottom surface S2 of the chamber 201 and the horizontal extension H204 of the shielding component 204 (i.e., the second channel d2), so that a positive pressure is formed in a second containing space 223 of the chamber, and/or is introduced to between the inner wall surface S1 of the chamber 201 and the vertical extension V204 of the shielding component 204 (i.e., the first channel d1).

More specifically, the containing space 22 in the chamber 201 can be divided into a first containing space 221 and a second containing space 223, wherein the first containing space 221 is above the stage 202 and in between the stage 202 and the upper part of the inner surface S of the chamber 201, and the second containing space 223 is below the stage 202 and in between the stage 202 and the lower part of the inner surface S of the chamber 201.

The horizontal extension H204 of the shielding component 204 is disposed in the second containing space 223 of the chamber 201, and there is a gap G1 between the horizontal extension H204 and the inner bottom surface S2 of the chamber 201, wherein the gap G1 is connected to the second containing space 223. After the gas G is introduced to between the inner bottom surface S2 of the chamber 201 and the horizontal extension H204 of the shielding component 204, the gas G diffuses to the gap G1 and diffuses to the second containing space 223 through the gap G1. The top end of the vertical extension V204 of the shielding component 204 is disposed in the first containing space 221 of the chamber 201, and there is a gap G1 between the vertical extension V204 and the inner wall surface S1 of the chamber 201, wherein the gap G1 is connected to the first containing space 221. After the gas G is introduced to between the inner wall surface S1 of the chamber 201 and the vertical extension V204 of the shielding component 204, the gas G diffuses to the gap G1 and diffuses to the first containing space 221 through the gap G1. In some embodiments, the shielding component 204 may include a first shielding component 2041 and a second shielding component 2042, and there is a slit G2 between the first shielding component 2041 and the second shielding component 2042, wherein the gas G can diffuse to the gap G1 and diffuse to the first containing space 221 or the second containing space 223 through the slit G2.

In other embodiments, the shielding component 204 may be connected to the inner bottom surface S2 or the inner wall surface S1 of the chamber 201, and the place where the shielding component 204 is connected to the inner bottom surface S2 or the inner wall surface S1 may have a slit to allow gas G to be able to diffuse to every part of the gap G1 and then flow into the containing space 22 of the chamber 201.

When the gas G is introduced into the chamber 201 to make the pressure of the second containing space 223 greater than the pressure of other areas in the chamber 201, the precursor P1 is driven toward, over, and above the shielding component 204 and/or the stage 202. In this way, the pumping port 203 can be assisted to continuously pump out the precursor P1 from the chamber 201, preventing the precursor P1 from remaining on the inner surface S of the chamber 201 or other equipment, such as the inner wall surface S1, the inner bottom surface S2, the stage 202, and the adjacent area between the shielding component 204 and the stage 202.

Figure 4:
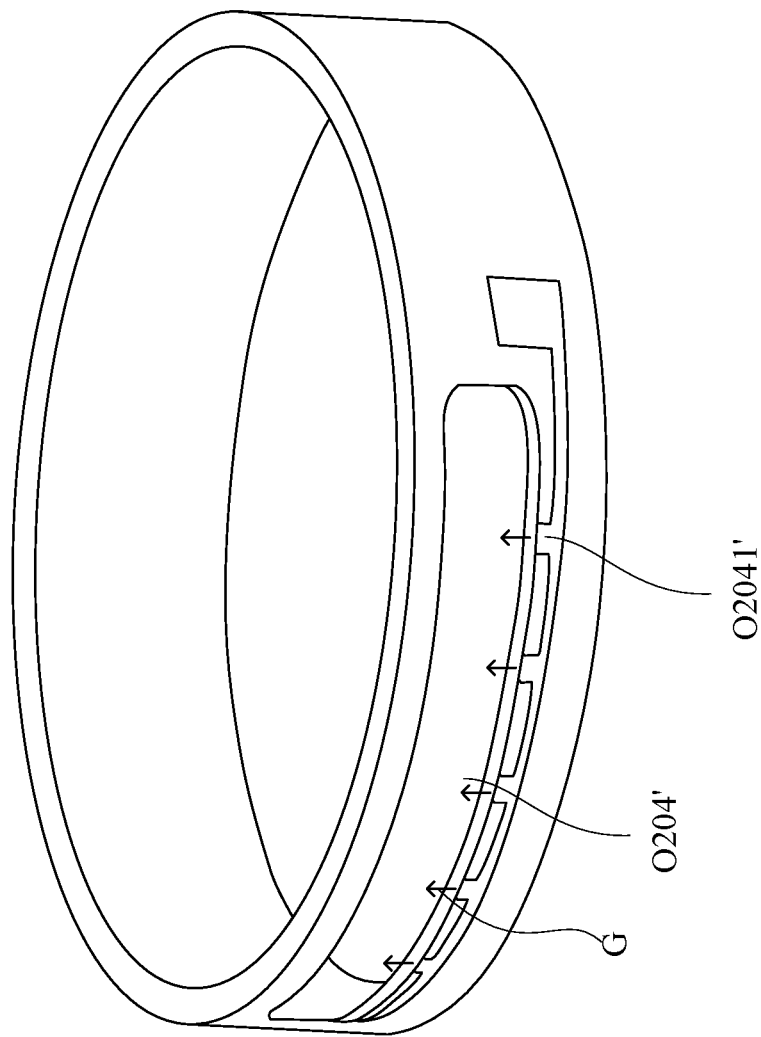
FIG. 4 is a three-dimensional schematic diagram of a shielding component according to another embodiment of the present disclosure.

In other embodiments, the shielding component 204 disposed in the chamber may only include the vertical extension V204 for shielding part of the inner wall surface S1 of the chamber 201. The gas G is introduced from the plurality of gas inlets O2012 to between the part of the inner wall surface S1 of the chamber 201 and the shielding component 204, and the gas G diffuses from the gap G1 to the containing space 22, thereby preventing precursors from remaining on the inner wall surface S1 of the chamber 201. Referring to FIG. 4, in another embodiment, the shielding component 204' is a hollow cylindrical body.

The shielding component 204' includes a substrate entrance O204' and at least one channel O2041', and the channel O2041' is fluidly connected to the substrate entrance O204', wherein the substrate entrance O204' is used to transport the substrate W into the chamber 201. The channel O2041' is a groove disposed on the outer surface of the shielding component 204' and is fluidly connected to the substrate entrance O204'.

When the shielding component 204' is disposed in the chamber 201 and the atomic layer deposition process is performed, the gas G introduced from the gas inlet O2012 can also be transported to the substrate entrance O204' through the channel O2041' to form a gas wall and/or positive pressure. That is, when the gas G is introduced from the plurality of gas inlets O2012 to between the part of the inner wall surface S1 of the chamber 201 and the shielding component 204', the gas G is also introduced to between the substrate entrance O204' and the inner surface S of the chamber 201. This can prevent the precursors from entering the substrate entrance O204' of the shielding component 204'. The path of the channel O2041' and the gas G is not limited to the bottom-to-top direction as shown in FIG. 4, but can also be top-to-bottom, left-to-right, right-to-left or other paths, and its purpose is to form a gas wall and/or positive pressure to prevent the precursors from being deposited on the substrate entrance O204' of the shielding component 204'. It is conceivable that the shielding component 204 shown in FIG. 3 may also be disposed with a channel O241' and a substrate entrance O204'.

Figure 5:
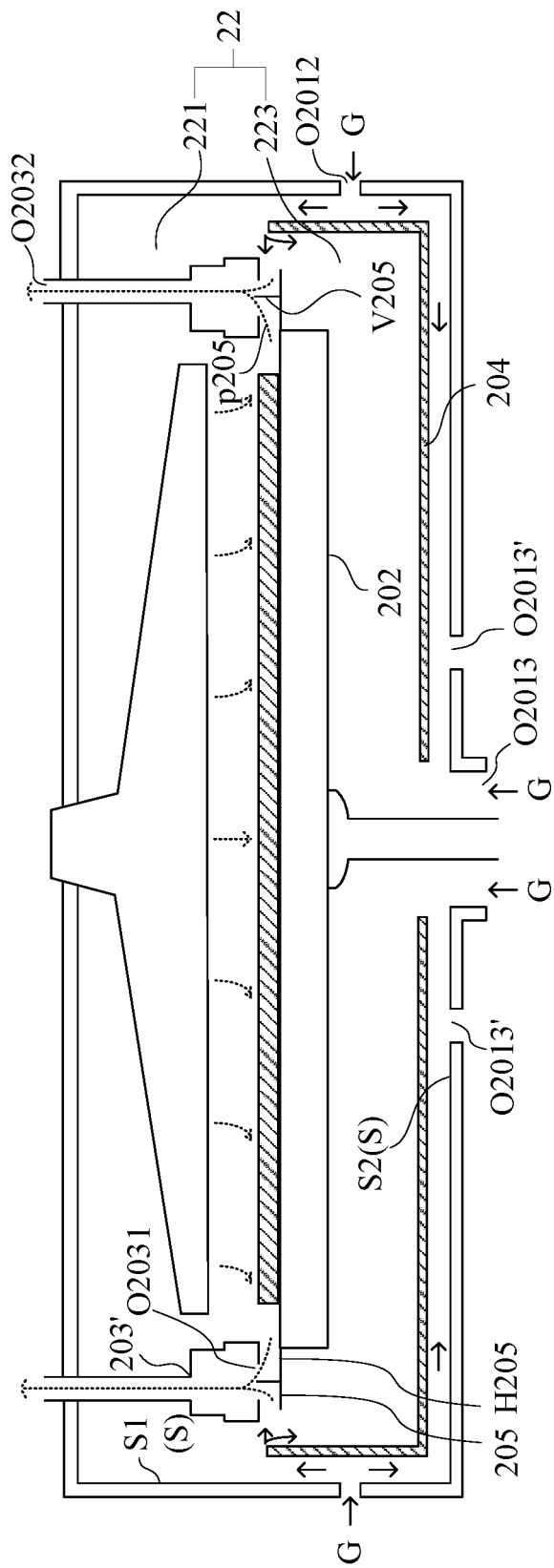
FIG. 5 is a schematic diagram of an atomic layer deposition equipment capable of reducing precursor deposition according to another embodiment of the present disclosure.

FIG. 5 is a schematic diagram of an atomic layer deposition equipment capable of reducing precursor deposition according to another embodiment of the present disclosure. The structure of the atomic layer deposition equipment capable of reducing precursor deposition 2' is roughly the same as that of FIG. 2, except that the atomic layer deposition equipment capable of reducing precursor deposition 2' further includes a hollow component 203', at least one baffle 205, a second pumping port O2013' and a second opening O2013, wherein the position of the hollow component 203' is higher than that of the stage 202, the baffle 205 is disposed below the hollow component 203', and the second pumping port O2013' and the second opening O2013 are both disposed on the inner surface S of the chamber 201, and are adjacent to the bottom of the stage 202. More specifically, the bottom H205 of the baffle 205 is connected to the stage 202, and the baffle 205 is disposed on the outer edge of the stage 202 and below the hollow component 203'. The second pumping port O2013' and the second opening O2013 are disposed on the inner bottom surface S2 of the chamber 201, and the second pumping port O2013' and the second opening O2013 are fluidly connected to the containing space 22 of the chamber 201.

The hollow component 203' includes a pumping port O2031, a top opening O2032 and a hollow section penetrating the pumping port O2031 and the top opening O2032, wherein the hollow section can be connected to the outside of the chamber 201. The hollow component 203' and the pumping port O2031 are used to pump out at least one unreacted precursor from the chamber 201. Furthermore, the unreacted precursor P1 in the containing space 22 of the chamber 201 can also be pumped out from the second pumping port O2013'. The hollow component 203' and the second pumping port O2013' will also pump out part of the gas G in the containing space 22.

In an embodiment, a part of the bottom of the hollow component 203' is correspondingly disposed above the stage 202, but there is no limitation thereto. The entire bottom of the hollow component can also be disposed above the stage, or the bottom of the hollow component can also be disposed entirely above somewhere outside of the stage (i.e. where none of the bottom of the hollow component is disposed above the stage). Furthermore, the pumping port O2031 of the hollow component 203' is disposed at the bottom of each hollow component 203', but there is no limitation thereto. The pumping port can also be disposed on the side of the hollow component. There are no limitations on the shape of the hollow component and the path of the hollow section.

Figure 6:
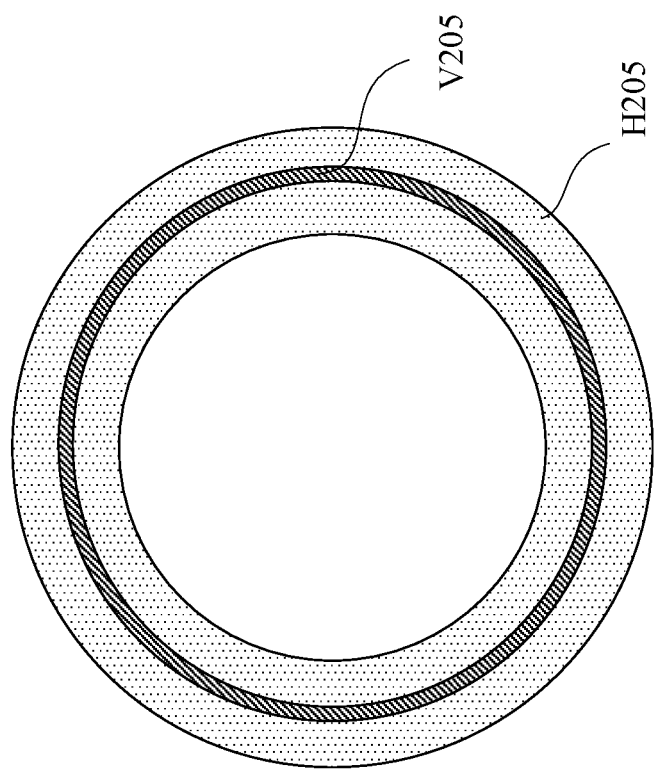
FIG. 6 is a top view of a baffle according to another embodiment of the present disclosure.

The baffle is disposed below the hollow component, and includes a bottom and at least one annular protrusion connected to each other (the annular part is not shown in FIG. 5). Referring to FIG. 6, the bottom H205 of the baffle 205 may be a flat annular structure, and the annular protrusion V205 is a convex structure provided on the (upper) surface of the bottom H205. The annular protrusion V205 of the baffle 205 corresponds to the pumping port O2031 of the hollow component 203', and an upper exhaust path p205 is formed between the baffle 205 and the pumping port O2031 of the hollow component 203', such that most of the unreacted precursors can be guided to the pumping port O2031 of the hollow component 203'. The bottom H205 of the baffle 205 is connected to the stage 202. In other embodiments, the annular protrusion V205 of the baffle 205 may not correspond to the pumping port O2031 of the hollow component 203', or the baffle 205 may not exist, and the hollow component 203' may be replaced by the pumping port.

FIG. 5 only presents one embodiment, and is not a limitation of the scope of claims. In other embodiments, the baffle 205 can also be connected to the hollow component 203' by the annular protrusion V205. Regardless of whether the baffle 205 is connected to the stage 202 or to the hollow component 203', it can be formed integrally or combined by parts.

In the cross-section of each baffle 205, the annular protrusion V205 and the bottom H205 form an inverted T shape, but there is no limitation thereto, and the cross-section could be, for example, an L shape in different embodiments. Referring to FIG. 6, the baffle 205 is an annular structure formed by at least one annular protrusion V205 and a bottom H205, wherein the annular protrusion V205 and the bottom H205 of the baffle 205 are not limited to being formed integrally or combined by multiple components.

In one embodiment, the atomic layer deposition equipment capable of reducing precursor deposition 2' may include at least one second opening O2013, wherein the second opening O2013 is disposed on the inner bottom surface S2 of the chamber 201. The gas G can be introduced into the chamber 201 from the second opening O2013 and form a positive pressure in the second containing space 223 of the chamber 201 to prevent precursors from remaining on the stage 202 (for example, the bottom of the stage).

The hollow component 203' is disposed in the first containing space 221. Part or the entire shielding component 204 is disposed in the second containing space 223. For example, the vertical extension V204 of the shielding component 204 can be extended from the second containing space 223 to the first containing space 221. The gas inlet O2012 is usually connected to the inner wall surface S1 disposed in the second containing space 223. More specifically, the gas inlet O2012 is usually disposed on the inner wall surface S1 blocked by the shielding component 204. The second opening O2013 is connected to the inner bottom surface S2 disposed in the second containing space 223, for example, but not limited to being adjacent to the bottom of the stage 202.

The gas G is introduced into the second containing space 223 of the chamber 201 from the gas inlet O2012 and/or the second opening O2013, so that the pressure of the second containing space 223 can be increased, and the amount of precursors entering the second containing space 223 can be reduced. In this way, the precursors can be prevented from remaining on the inner wall surface S1, the inner bottom surface S2, the shielding component 204, the bottom of the stage 202, and/or the lifting component at the bottom of the stage 202 in the second containing space 223.

Figure 7:
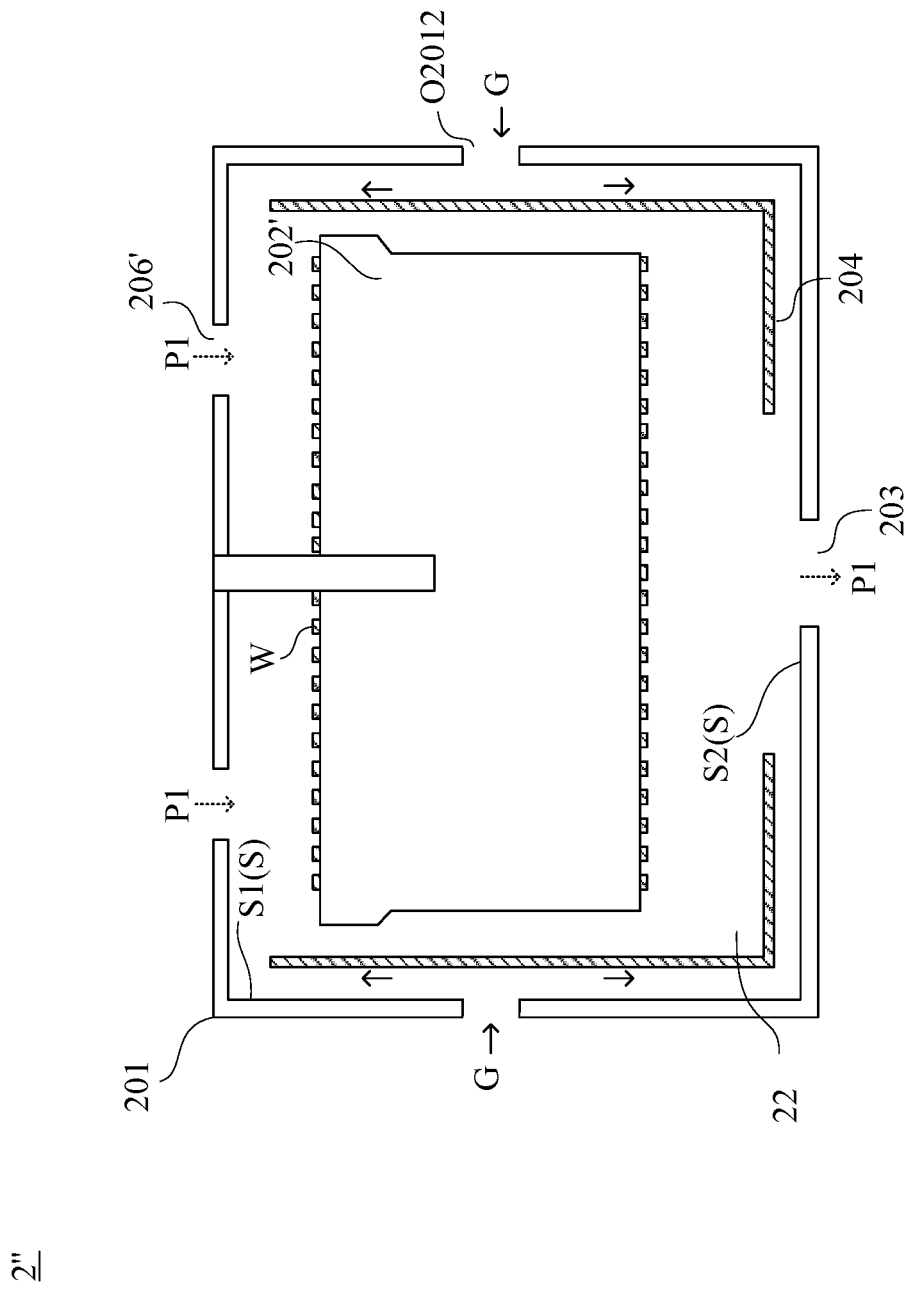
FIG. 7 is a schematic diagram of an atomic layer deposition equipment capable of reducing precursor deposition according to yet another embodiment of the present disclosure.

FIG. 7 is a schematic diagram of an atomic layer deposition equipment capable of reducing precursor deposition according to yet another embodiment of the present disclosure. The atomic layer deposition equipment capable of reducing precursor deposition 2" includes a chamber 201, a stage 202', at least one pumping port O203, a shielding component 204, at least one gas inlet O2012, and a precursor inlet 206'. The functions of the chamber 201, the pumping port O203, the shielding component 204, and the gas inlet O2012 are the same as those of the previous embodiments and therefore are not described herein.

The stage 202' is used to hold a substrate W (for example, a wafer), and the number of the substrate W to be held is not limited. The difference between the stage 202' of this embodiment and the stage 202 of the previous embodiment is the arrangement or quantity of the held substrates W. In the embodiment of FIGS. 2 and 5, the stage 202 is similar to a platform where at least one substrate W is placed on the upper surface of the stage 202 and the substrate W is approximately parallel to the horizontal plane. In contrast, the substrate W held by the stage 202' of this embodiment is perpendicular to the horizontal plane, and there is a gap between adjacent substrates W.

The precursor inlet 206' is fluidly connected to the containing space 22 of the chamber 201. The function of the precursor inlet 206' is similar to that of the shower head 206 of the previous embodiment, and both are used to transport the precursor P1 into the containing space 22 of the chamber 201, so the precursor inlet 206' can also be replaced by the shower head 206. The precursor inlet 206' and the pumping port 203 are positioned opposite to each other, and the stage 202' and the substrate W are disposed between the precursor inlet 206' and the pumping port 203. For example, the precursor inlet 206' is disposed at the top of the chamber 201, and the pumping port 203 is disposed at the bottom of the chamber 201. The inner wall surface S1 with the gas inlet O2012 is adjacent to the top surface with the precursor inlet 206' and/or the pumping port 203 and the inner bottom surface S2, but there is no limitation thereto. It is conceivable that the atomic layer deposition equipment capable of reducing precursor deposition 2" may also include the second opening O2013 shown in FIG. 5, for example, the second opening O2013 is disposed on the inner bottom surface S2 of the chamber 201 for introducing the gas G into the chamber 201.

The range of the inner surface S of the chamber 201 shielded by the shielding component 204 is not limited. For example, the shielding component 204 shields part of the inner wall surface S1 and most of the inner bottom surface S2, as shown in FIG. 2, or the shielding component 204 shields most of the inner wall surface S1 and part of the inner bottom surface S2, as shown in FIG. 7. From the gas inlet O2012, gas G can be introduced to a space between the shielding component 204 and the inner bottom surface S2 and the inner wall surface S1 of the chamber 201, and a positive pressure is formed in parts of the containing space 22 of the chamber 201 (for example, the left and right sides of the chamber 201). In this way, the precursor P1 is assisted in being pumped out of the chamber 201 from the pumping port 203, and there is less precursor P1 attached to the inner surface S of the chamber 201 shielded by the shielding component 204.

Figure 8:
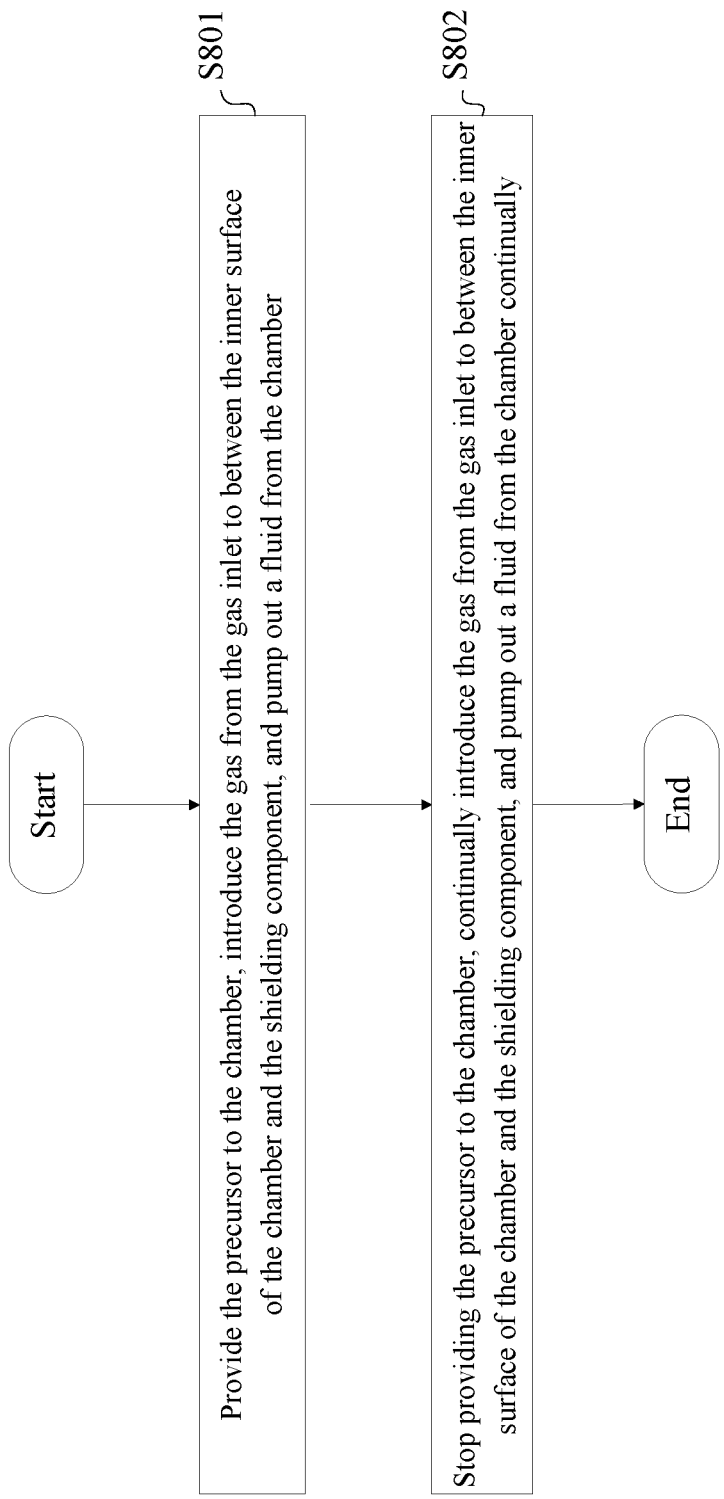
FIG. 8 is a flowchart of an atomic layer deposition process according to an embodiment of the present disclosure.

Referring to FIG. 8 and FIG. 2 for the atomic layer deposition process method of applying the atomic layer deposition equipment capable of reducing precursor deposition 2 according to the present disclosure. FIG. 8 is a flowchart of atomic layer deposition process according to an embodiment of the present disclosure.

Referring to the step S801, the precursor P1 is provided to the containing space 22 of the chamber 201 to react with the substrate W. The gas G is introduced from the gas inlet O2012 to between the inner surface S of the chamber 201 and the shielding component 204, so that the gas G diffuses to the gap G1 between the shielding component 204 and the chamber 201 and diffuses to the containing space 22 of the chamber 201 through the gap G1. A fluid is pumped out from the chamber 201 by the pumping port 203, wherein the fluid could be air, the original gas in the chamber 201, the precursor P1, or the gas G. The gas G can form a gas wall and/or positive pressure in part of the containing space 22 of the chamber 201 to assist the pumping port 203 to pump out the remaining precursor P1.

In the case of the shielding component 204 having the substrate entrance O204', as shown in FIG. 4, the substrate W is transported into the chamber 201 via the substrate entrance O204', and the gas G is introduced to between the substrate entrance O204' and the inner surface S of the chamber 201. The shielding component 204 may also include at least one channel O2041', and the gas G introduced from the gas inlet O2012 can also flow to the substrate entrance O204' through/via the channel O2041' to form a gas wall and/or positive pressure. More specifically, when the gas G is introduced from the plurality of gas inlets O2012 to between the part of the inner wall surface S1 of the chamber 201 and the shielding component 204, the gas G is also introduced to between the substrate entrance O204' and the inner surface of the chamber 201. Therefore, the precursor P1 can be prevented from entering the substrate entrance O204' of the shielding component 204.

More specifically, in the present disclosure, the gas G is introduced to between the shielding component 204 and a part of the inner surface S of the chamber 201. For example, the pressure of the second containing space 223 between the bottom of the stage 202 and the inner surface S of the chamber 201 can be increased, and thereby reducing the amount of the precursor P1 entering the second containing space 223, as shown in FIG. 2. The steps of introducing the precursor P1, introducing the gas G from the gas inlet O2012, and pumping out the remaining precursor P1 from the pumping port 203 are not performed in a certain sequence. In actual application, the gas G can be introduced from the gas inlet O2012 first, the fluid (such as, air, original gas in the chamber 201 and/or the gas G) is pumped out from the pumping port 203 next, and then the precursor P1 is introduced into the chamber 201. The above three steps can also occur simultaneously.

In the case of using the atomic layer deposition process method of applying the atomic layer deposition equipment capable of reducing precursor deposition 5, the fluid is pumped out from the pumping port O2031 of the hollow component 203' by the upper exhaust path p205 formed between the baffle 205 and the pumping port O2031 of the hollow component 203', wherein the baffle 205 has the bottom H205 and the annular protrusion V205 and is disposed below the hollow component 203'. Furthermore, the second pumping port O2013' is also used to pump out the gas G or the precursor P1 in the containing space 223 of the chamber 201. The second opening O2013 of the atomic layer deposition equipment capable of reducing precursor deposition 5 also introduces the gas G into the containing space 22 of the chamber 201 to prevent the precursor P1 from remaining on the inner wall surface S1, the inner bottom surface S2, and the shielding component 204, the bottom of the stage 202 and/or the lifting component at the bottom of the stage 202 in the containing space 22.

Next, in the step S802, after the target amount of the precursor P1 for the process is reached, the precursor P1 is stopped from being provided to the chamber 201. The gas G is continually introduced from the gas inlet O2012 to between the inner surface S of the chamber 201 and the shielding component 204 and the fluid is pumped out from the chamber 201 by the pumping port 203 continually. The unreacted precursors are pumped out of the chamber 201 from the pumping port 203.

The atomic layer deposition process method further includes a cleaning process to reduce the deposition of the precursors on the atomic layer deposition equipment capable of reducing precursor deposition. After a certain period of time in the atomic layer deposition process (i.e., when it's time to clean the atomic layer deposition equipment capable of reducing precursor deposition), the shielding component can be removed, and the cleaned or a new shielding component 204 is installed in the chamber 201. Similarly, the baffle 205 can also be removed, and a cleaned or new baffle 205 can be installed in the chamber 201, wherein the cleaned baffle is not limited to the baffle that is just removed and cleaned. In this way, by directly replacing the clean shielding component 204 and the baffle 205, the cleaning efficiency can be improved, thereby increasing the production capacity.

The use of the atomic layer deposition equipment capable of reducing precursor deposition does not affect the effect of atomic layer deposition. Referring to Table 1, which shows the wafer thickness and the uniformity after the atomic layer deposition process. After performing deposition on the substrate using the atomic layer deposition equipment capable of reducing precursor deposition, the uniformity of the wafer is 0.407.

TABLE 1

| Average thickness of wafer | 121.97 nm |
|---|---|
| Wafer uniformity (U %) | 0.407 |

Finally, the advantage of the atomic layer deposition equipment capable of reducing precursor deposition will be explained. The remaining precursor P1 is affected by the pressure created by the gas G, so that most of the unreacted precursor P1 is pumped out from the pumping port 203. Only a small amount of the remaining precursor P1 adheres to the shielding component 204 instead of directly adhering to the inner surface S of the chamber 201, such as, the inner bottom surface S2 and/or the inner wall surface S1. Since the precursors remaining in the chamber are reduced, the operation period before chamber 201 needs to be cleaned can be extended. Furthermore, when cleaning the atomic layer deposition equipment capable of reducing precursor deposition, the shielding component 204 can be directly replaced, or the shielding component 204 can be removed for cleaning (in one embodiment, the baffle 205 can also be directly replaced or cleaned). In this way, the cleaning effect and efficiency can be improved, and the situation of dirt remaining in the chamber 201 can be mitigated. The atomic layer deposition equipment capable of reducing precursor deposition not only can extend the lifetime of each component, but also improve product yield and productivity.

In conclusion, the technical benefits of the atomic layer deposition equipment capable of reducing precursor deposition and the atomic layer deposition process method using the same of the present disclosure are described in the following.

In the conventional technology, during the atomic layer deposition process, the remaining unreacted precursors often adhere to the chamber wall, causing problems such as difficult or incomplete cleaning, short cleaning cycle, and affected product yield. The present disclosure provides an atomic layer deposition equipment capable of reducing precursor deposition that can create local pressure in the chamber, use the pumping port to pump out most of the remaining precursors, and make the remaining precursors not attached to the chamber wall by having the shielding component. Further, during cleaning, components can be easily replaced to improve cleaning efficiency and effect, thereby optimizing product yield and increasing productivity.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

The invention claimed is:

1. An atomic layer deposition equipment capable of reducing precursor deposition, comprising:
a chamber comprising an inner surface for defining a containing space;
a stage disposed in the containing space of the chamber for supporting at least one substrate;
a precursor inlet fluidly connected to the containing space of the chamber, for providing at least one precursor into the containing space of the chamber;
at least one pumping port fluidly connected to the containing space of the chamber, for exhausting at least one precursor in the containing space of the chamber;
a shielding component disposed in the containing space of the chamber and shielding part of the inner surface of the chamber, wherein there is a gap between the shielding component and the inner surface of the chamber, and the gap is connected to the containing space;
at least one gas inlet disposed on the inner surface of the chamber, wherein the shielding component shields the gas inlet, the gas inlet introduces an inactive gas to between the shielding component and the inner surface of the chamber to make the inactive gas diffuse to the gap between the shielding component and the chamber, and the inactive gas diffuses to the containing space of the chamber through the gap;
at least one hollow component, wherein the pumping port is disposed in the hollow component and the position of the hollow component is higher than the stage; and
a baffle disposed below the hollow component, wherein there is an upper exhaust path formed between the baffle and the pumping port of the hollow component, wherein the baffle comprises a bottom and at least one annular protrusion, the annular protrusion is disposed on a surface of the bottom, and the bottom of the baffle is connected to the stage.

2. The atomic layer deposition equipment capable of reducing precursor deposition of claim 1, wherein the inner surface comprises an inner wall surface and an inner bottom surface, the shielding component shields part of the inner wall surface and part of the inner bottom surface of the chamber, the gap between the shielding component and the inner surface of the chamber comprises a gap between the shielding component and the inner wall surface and a gap between the shielding component and the inner bottom surface, the inactive gas is introduced from the gas inlet and diffuses to the gap between the shielding component and the inner wall surface and the gap between the shielding component and the inner bottom surface, and the inactive gas diffuses to the containing space of the chamber through the gaps.

3. The atomic layer deposition equipment capable of reducing precursor deposition of claim 2, further comprising at least one second pumping port disposed on the inner bottom surface of the chamber and fluidly connected to the containing space of the chamber, for exhausting the inactive gas or at least one precursor in the containing space of the chamber.

4. The atomic layer deposition equipment capable of reducing precursor deposition of claim 1, wherein the shielding component comprises a substrate entrance, the substrate is transported into the chamber from the substrate entrance, and the inactive gas is introduced to between the substrate entrance and the inner surface of the chamber.

5. The atomic layer deposition equipment capable of reducing precursor deposition of claim 4, wherein the shielding component further comprises at least one channel fluidly connected to the substrate entrance, the inactive gas introduced from the gas inlet is introduced into the substrate entrance via the channel to prevent the precursor from entering the substrate entrance of the shielding component.

6. The atomic layer deposition equipment capable of reducing precursor deposition of claim 1, wherein the inactive gas does not react with the precursor.

7. The atomic layer deposition equipment capable of reducing precursor deposition of claim 2, further comprising at least one second opening disposed on the inner bottom surface of the chamber, for introducing the inactive gas into the containing space of the chamber.

* * * * *